(12) United States Patent
Yoon et al.

(10) Patent No.: US 10,957,477 B2
(45) Date of Patent: Mar. 23, 2021

(54) INDUCTOR

(71) Applicant: SAMSUNG ELECTRO-MECHANICS CO., LTD., Suwon-si (KR)

(72) Inventors: Chan Yoon, Suwon-si (KR); Dong Hwan Lee, Suwon-si (KR); Young Ghyu Ahn, Suwon-si (KR); Won Chul Sim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 330 days.

(21) Appl. No.: 16/059,747

(22) Filed: Aug. 9, 2018

(65) Prior Publication Data

US 2019/0259527 A1    Aug. 22, 2019

(30) Foreign Application Priority Data

Feb. 22, 2018    (KR) .......................... 10-2018-0021049

(51) Int. Cl.
*H01F 27/29*    (2006.01)
*H01F 17/00*    (2006.01)
(Continued)

(52) U.S. Cl.
CPC ............. *H01F 27/292* (2013.01); *H01F 3/00* (2013.01); *H01F 5/04* (2013.01); *H01F 17/0013* (2013.01);
(Continued)

(58) Field of Classification Search
CPC .. H01F 27/292; H01F 27/324; H01F 17/0013; H01F 17/0033; H01F 17/04;
(Continued)

(56) References Cited

U.S. PATENT DOCUMENTS 7,675,396 B2* 3/2010 Liu .......................... H01F 17/04
336/200
9,905,349 B2* 2/2018 Park ........................ H01F 17/04
(Continued)

FOREIGN PATENT DOCUMENTS

KR    10-2005-0011090 A    1/2005
KR    10-2016-0032580 A    3/2016
KR    10-2017-0004121 A    1/2017

*Primary Examiner* — Tuyen T Nguyen
(74) *Attorney, Agent, or Firm* — Morgan, Lewis & Bockius LLP

(57) ABSTRACT

An inductor includes a body including a support member having a first through-hole, a second through-hole, a first via-hole and a second via-hole, the first and second via-holes being spaced apart from the first and second through-holes, a first coil unit and a second coil unit disposed on one surface of the support member, a third coil unit and a fourth coil unit facing the one surface of the support member, and an encapsulant encapsulating the support member and the first to fourth coil units and including a magnetic material, and a first external electrode to a fourth external electrode respectively connected to the first to fourth coil units on an external surface of the body. The encapsulant includes a first encapsulant and a second encapsulant having magnetic permeability different from each other.

14 Claims, 3 Drawing Sheets

(51) Int. Cl.
*H01F 17/04* (2006.01)
*H01F 5/04* (2006.01)
*H05K 1/18* (2006.01)
*H01F 3/00* (2006.01)
*H01F 27/32* (2006.01)

(52) U.S. Cl.
CPC ......... *H01F 17/0033* (2013.01); *H01F 17/04* (2013.01); *H01F 27/324* (2013.01); *H05K 1/181* (2013.01); *H01F 2017/0066* (2013.01); *H01F 2017/0073* (2013.01); *H01F 2017/048* (2013.01); *H05K 2201/1003* (2013.01)

(58) Field of Classification Search
CPC ...... H01F 5/04; H01F 3/00; H01F 2017/0073; H01F 2017/0066; H01F 2017/048; H05K 1/181; H05K 2201/1003
See application file for complete search history.

(56) References Cited

U.S. PATENT DOCUMENTS

2016/0078986 A1* 3/2016 Yoon .................. H01F 17/0013
336/83
2017/0006706 A1 1/2017 Yoon et al.

\* cited by examiner

INDUCTOR

CROSS-REFERENCE TO RELATED APPLICATION(S)

This application claims the benefit of priority to Korean Patent Application No. 10-2018-0021049 filed on Feb. 22, 2018 in the Korean Intellectual Property Office, the disclosure of which is incorporated herein by reference in its entirety.

TECHNICAL FIELD

The present disclosure relates to an inductor, and more particularly, to a coupled inductor.

BACKGROUND

As electronic IT devices evolve demand for a thinned power inductor having a compact size, which is able to withstand high current, high efficiency, and high performance, increases. Therefore, to meet the increasing demand for miniaturization of an inductor, attempts on various arrays having reduced mounting areas are being made. Such arrays may include a noncoupled or coupled inductor form or a mixture thereof, depending on a coupling coefficient or mutual inductance among a plurality of coil units.

SUMMARY

An aspect of the present disclosure is to provide an inductor in which a coupling coefficient of the inductor may be easily controlled.

According to an aspect of the present disclosure, an inductor includes a body including a support member having a first through-hole, a second through-hole, a first via-hole and a second via-hole, the first and second via-holes being spaced apart from the first and second through-holes, a first coil unit and a second coil unit disposed on a first surface of the support member, a third coil unit and a fourth coil unit disposed on a second surface of the support member facing the one surface of the support member, and an encapsulant encapsulating the support member and the first to fourth coil units and including a magnetic material, and a first external electrode to a fourth external electrode disposed on an external surface of the body and respectively connected to the first to fourth coil units. The encapsulant includes a first encapsulant and a second encapsulant, and magnetic permeability of the first encapsulant different from magnetic permeability of the second encapsulant.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
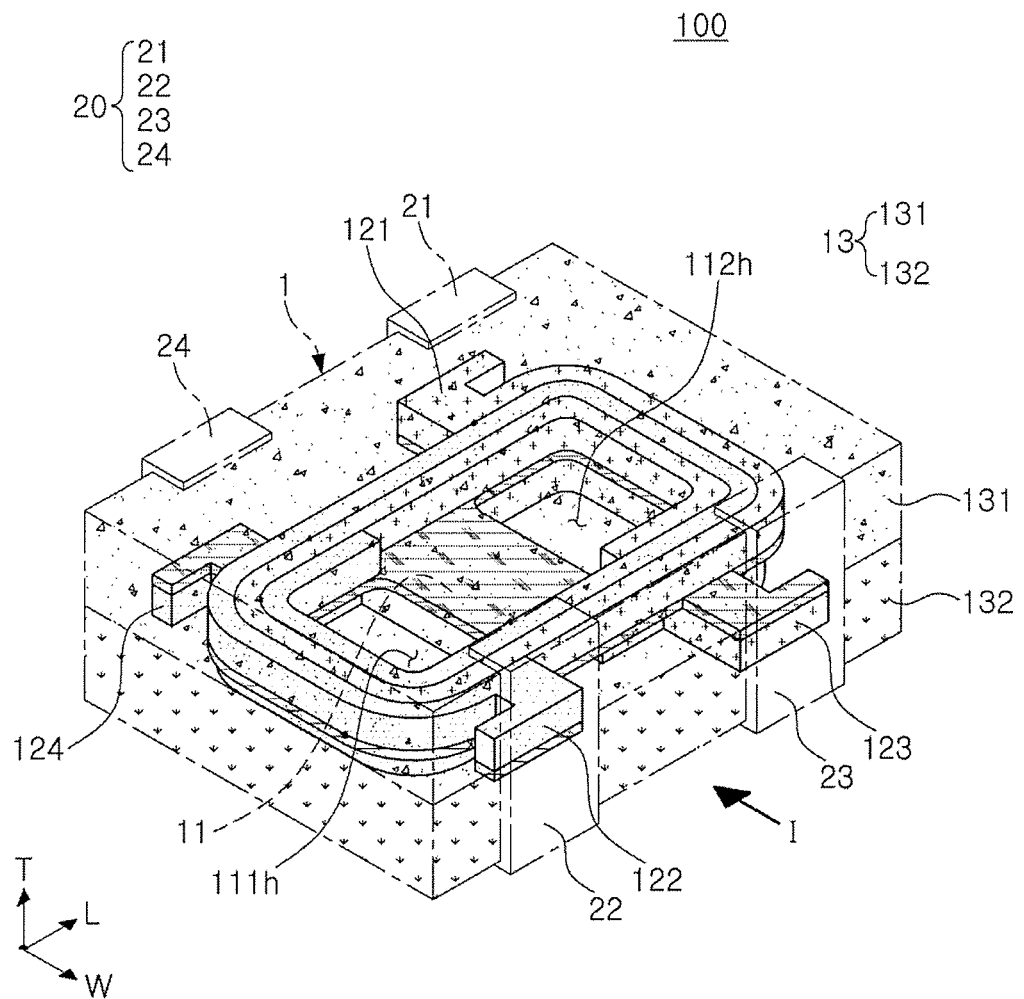
FIG. 1 is a perspective view of an inductor according to an example of the present disclosure.

Hereinafter, exemplary embodiments in the present disclosure will be described with reference to the specific embodiments and the accompanying drawings. However, the present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

Further, in the drawings, for the increased clarity of the present disclosure, a portion of the drawing irrelevant to a corresponding description will be omitted, for the clear illustration of several layers and areas, views of enlarged portions thereof will be provided, and elements having the same functions within the same scope of the present disclosure will be designated by the same reference numerals.

Throughout the specification, when a component may be referred to as "comprise" or "comprising", it means that it may include other components as well, rather than excluding other components, unless specifically stated otherwise.

Hereinafter, an inductor according to an example of the present disclosure will be described, but is not necessarily limited thereto.

Figure 2:
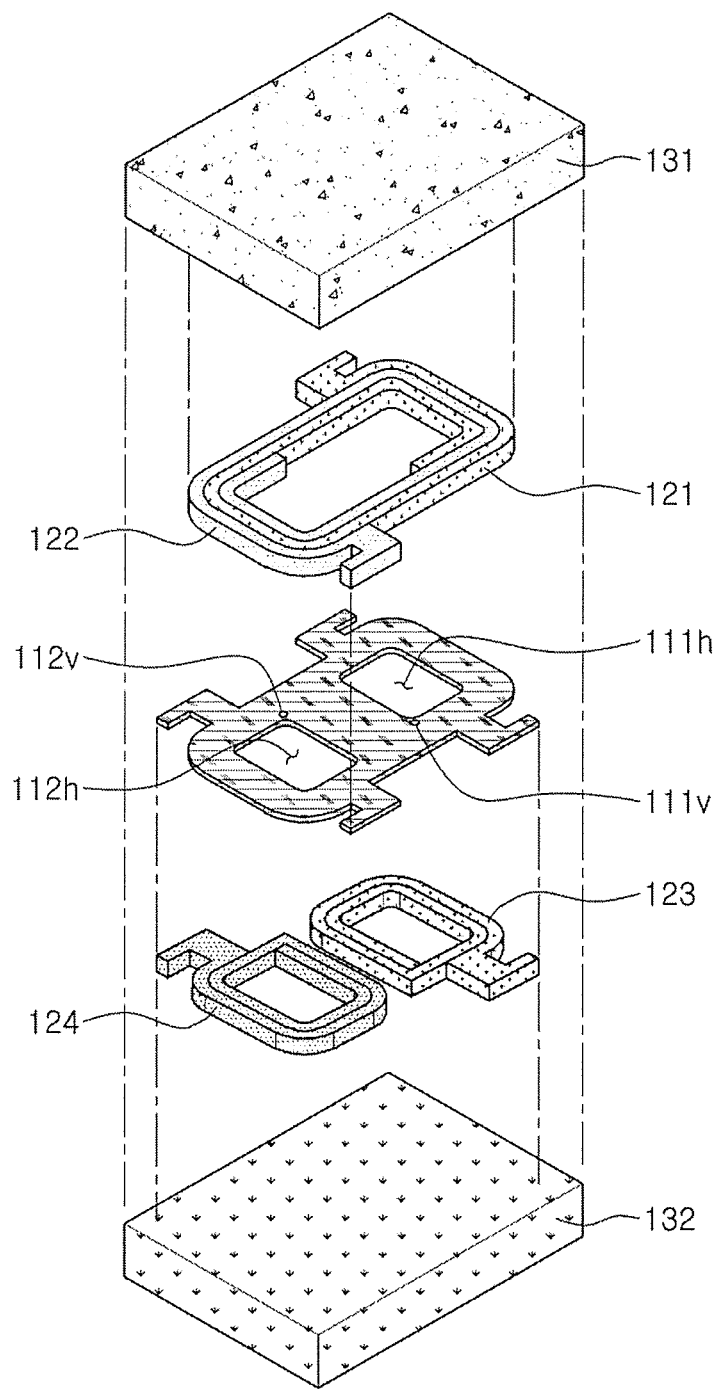
FIG. 2 is a schematic exploded perspective view of FIG. 1.
Figure 3:
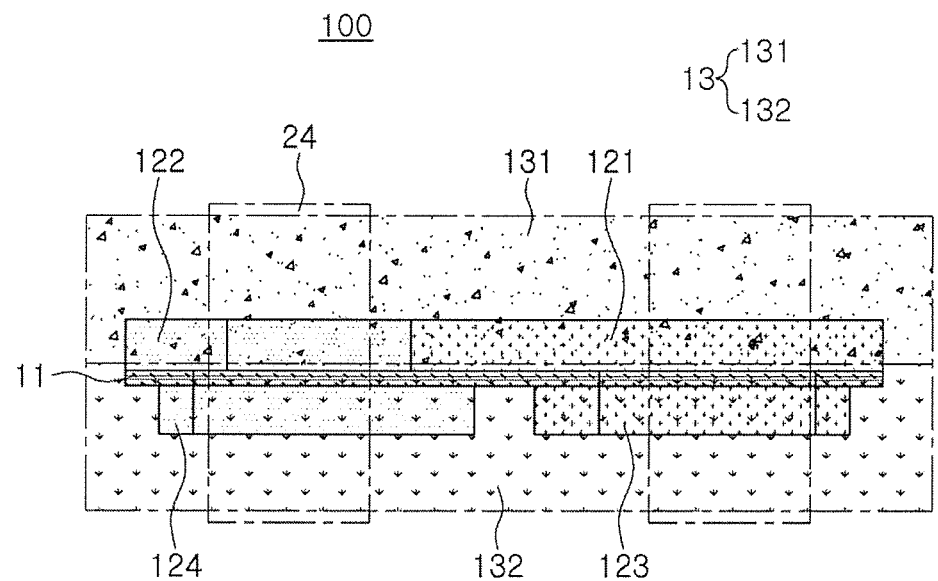
FIG. 3 is a cross-sectional view taken along line I-I' of FIG. 1.

FIG. 1 a perspective view of an inductor 100 according to an example of the present disclosure, FIG. 2 is an exploded perspective view of FIG. 1, and FIG. 3 is a cross-sectional view taken along line I-I' of FIG. 1.

Referring to FIGS. 1 to 3, the inductor 100 includes a body 1 and external electrodes 20.

The body 1, which substantially forms an exterior surface of the inductor 100, includes an upper surface and a lower surface facing each other in a thickness direction T, a first end surface and a second end surface facing each other in a length direction L, a first side surface and a second side surface facing each other in width direction W, to have a substantially hexahedral shape, but not limiting thereto.

The body 1 includes a support member 11, first to fourth coil units 121 to 124, and an encapsulant 13 encapsulating the support member 11 and the first to fourth coil units 121 to 124.

Since a support member 11 has a function of supporting a coil unit on one surface and the other surface thereof, the support member 11 should be made of a material having proper rigidity for supporting, and may have magnetic properties or insulating properties. The support member 11 may be a conventional Copper Clad Laminate (CCL) substrate, a PID resin, an ABF film, or the like, or may be a material impregnated with a glass fiber within an insulating substrate.

The support member 11 includes a first through-hole 111h and a second through-hole 112h disposed to be spaced apart from each other. The first and second through-holes 111h and 112h have a configuration of being filled with a magnetic material to form a magnetic core center. The first and second through-holes 111h and 112 h may be formed to be spaced apart by a predetermined distance in a length direction L of the body 1, but are not limited thereto. A cross-sectional shape is not particularly limited. For example, the shape may be an ellipse or a quadrangle, and to have a shape corresponding to an inner interface of the innermost coil pattern of the coil unit is advantageous in terms of magnetic permeability.

A first via-hole 111v and a second via-hole 112v are formed to be spaced apart from the first and second through-holes 111h and 112h. Since the first and second via-holes lily and 112v function as paths for electrically connecting the coil units each other, the first and second via-holes 111ν and 112ν are filled with a conductive material.

Next, a first coil unit 121, a second coil unit 122, a third coil unit 123, and a fourth coil unit 124 are respectively disposed on a first surface and a second surface of the support member 11.

A first coil unit 121 and a second coil unit 122, which are wound on the same plane on the first surface of the support member 11, are wound adjacent to each other to share a core center. Since the first and second coil units 121 and 122 are disposed in a bifilar winding manner, the first and second coil units 121 and 122 are closely disposed to each other and are wound to significantly reduce leakage inductance. Through an arrangement of these first and second coil units 121 and 122, a coupling coefficient of the first and second coil units 121 and 122 may be increased to about a level of 0.9 or more.

A third coil unit 123 and a fourth coil unit 124, which are wound on the same plane on the second surface of the support member 11, are disposed to be spaced apart from each other. As described above, being disposed to be spaced apart means being physically spaced apart from each other. As a result, the third and fourth coil units 123 and 124 do not share core centers, but constitute the core centers in respectively different positions, unlike the first and second coil units 121 and 122 which share core centers. The core centers of the third and fourth coil units 123 and 124 may be disposed to be formed in the first and second through-holes 111h and 112h. Therefore, when the first and second through-holes 111h and 112h are spaced apart from each other in the length direction L of the body 1, the third and fourth coil units 123 and 124 are spaced apart from each other in the length direction L of the body 1. Since the third and fourth coil units 123 and 124 are arranged to be spaced apart from each other and not to share the core centers, the coupling coefficient of the third and fourth coil units 123 and 124 is less than approximately a level of 0.1.

In the case of the inductor 100 in which the arrangement of the first and second coil units 121 and 122 and the third and fourth coil units 123 and 124 are combined with each other, the coupling coefficient may be controlled to about a level of 0.1 to 0.9. When increasing the number of coil turns of the first and second coil units 121 and 122, the coupling coefficient of the inductor 100 will increase, and when increasing the number of coil turns of the third and fourth coil units 123 and 124, the coupling coefficient of the inductor 100 will decrease. However, when the coupling coefficient is to be controlled by changing the number of coil turns of the coil unit, the control is not appropriate because additional changes such as the overall size of the inductor, equipment facilities for winding the coil, and size change of the support member are required.

Therefore, the inductor 100 of the present disclosure is designed to control the coupling coefficient by differentiating the magnetic permeability of an encapsulant. In this case, the coupling coefficient may be freely controlled within the range of a level of 0.1 to 0.9 without changing the size of the additional equipment facilities or the configuration. The encapsulant includes a material having magnetic properties, for example, the encapsulant may have a structure in which magnetic metal particles, ferrite particles, and the like, are dispersed within a resin. In addition, the encapsulant may have a laminated structure in which a plurality of magnetic sheets are laminated, and may have a structure filled with a slurry including magnetic particles.

Referring to FIG. 3 according to an exemplary embodiment of the present disclosure, the encapsulant 13 includes a first encapsulant 131 adjacent to the first and second coil units 121 and 122 and a second encapsulant 132 adjacent to the third and fourth coil units 123 and 124. The first and second encapsulants 131 and 132 have a different interface from each other, which means that the first and second encapsulants 131 and 132 have different material properties, respectively. The different material properties mean that kinds of the magnetic particles included in the first and second encapsulants 131 and 132 are different from each other or that a packing rate of the magnetic particles in the resin is different while including the same kind of magnetic particles, but is not limited thereto. The first and second encapsulants 131 and 132 may be transformed without limitation within respective magnetic permeabilities of the first and second encapsulants 131 and The interface between the first encapsulant 131 and the second encapsulant 132 may be formed in a position between the first surface and the second surface of the support member 11. In this case, the support member 11 may be disposed in the center in the thickness direction T, which means that the thicknesses of the first and second encapsulants 131 and 132 are the same. Although the case in which the thicknesses of the first and second encapsulants 131 and 132 are the same is illustrated by way of example, a thickness ratio of the first and second encapsulants 131 and 132 may be finely adjusted as required.

When the magnetic permeability of the first encapsulant 131 is larger than the magnetic permeability of the second encapsulant 132, an influence of the coupling coefficient of the first and second coil units 121 and 122 becomes relatively strong, as a result, the coupling coefficient of the inductor 100 increases. On the other hand, when the magnetic permeability of the first encapsulant 131 is smaller than the magnetic permeability of the second encapsulant 132, the coupling coefficient of the third and fourth coil units 123 and 124 becomes relatively strong, as a result, the coupling coefficient of the inductor 100 decreases.

As described above, the coupling coefficient may be finely controlled by changing a volume ratio between the first and second encapsulants 131 and 132 as required, while differentiating the magnetic permeability of the first and second encapsulants 131 and 132 and maintaining the overall size of the encapsulant 13.

Table 1 below shows that the coupling coefficient (k) changes as respective magnetic permeability of the first and second encapsulants 131 and 132 is changed.

TABLE 1

| Magnetic permeability | | | |
| --- | --- | --- | --- |
| First encapsulant | Second encapsulant | Rdc [mOhm] | k |
| 35 | 35 | 34 | −0.52371 |
| 40 | 30 | 34 | −0.5377 |
| 30 | 40 | 34 | −0.50876 |

As can be seen from Table 1, since the number of coil turns or shape of the first to fourth coil units 121 to 124 is not changed, an Rdc value does not change according to the change of the magnetic permeability of the encapsulant 13.

According to Table 1, when the magnetic permeability of the first encapsulant 131 is increased and the magnetic permeability of the second encapsulant 132 is relatively decreased, the influence of the coupling coefficient of the first and second coil units 121 and 122 adjacent to the first encapsulant 131 increases, as a result, the coupling coefficient of the inductor 100 increases. While, when the magnetic permeability of the first encapsulant 131 is decreased, and the magnetic permeability of the second encapsulant 132 is relatively increased, the influence of the coupling coefficient of the third and fourth coil units 123 and 124 adjacent to the second encapsulant 132 increases, as a result, the coupling coefficient of the inductor 100 decreases.

As described above, by differentiating the magnetic permeability of the first and second encapsulants 131 and 132, the coupling coefficient of the inductor 100 may be easily controlled considering an application and a set structure. Particularly, by winding the first and second coil units 121 and 122 with a bifilar structure and disposing the third and fourth coil units 123 and 124 to be spaced apart to some extent, the coupling coefficient of the inductor 100 within the coupling coefficient of about 0.1 to 0.9 levels may be finely controlled.

Further, the first coil unit 121 is connected to the third coil unit 123 through the first via-hole 111v, and the second coil unit 122 is connected to the fourth coil unit 124 through the second via-hole 112v. In this case, the first and second via-holes 111v and 112v are required to be filled with a material having excellent electrical conductivity.

The first and second coil units 121 and 122 may include a line width and a length of the same coil pattern, and the third and fourth coil units 123 and 124 may include a line width and a length of the same coil pattern.

On the other hand, one end of the first coil unit 121 is connected to a first external electrode 21, and the other end of the first coil unit 121 is connected to the inside the first via-hole 111v connected to the third coil unit 123, one end of the second coil unit 122 is connected to a second external electrode 22, the other end of the second coil unit 122 is connected to the inside the second via-hole 112v connected to the fourth coil unit 124. Similarly, one end of the third coil unit 123 is connected to a third external electrode 23, the other end of the third coil unit 123 is connected to the inside the first via-hole 111v connected to the first coil unit 121, one end of the fourth coil unit 124 is connected to a fourth external electrode 24, the other end of the fourth coil unit 124 is connected to the inside the second via-hole 112v connected to the second coil unit 122.

The first and third external electrodes 21 and 23 may function as input terminals, and the second and fourth external electrodes 22 and 24 may function as output terminals.

Figure 4:
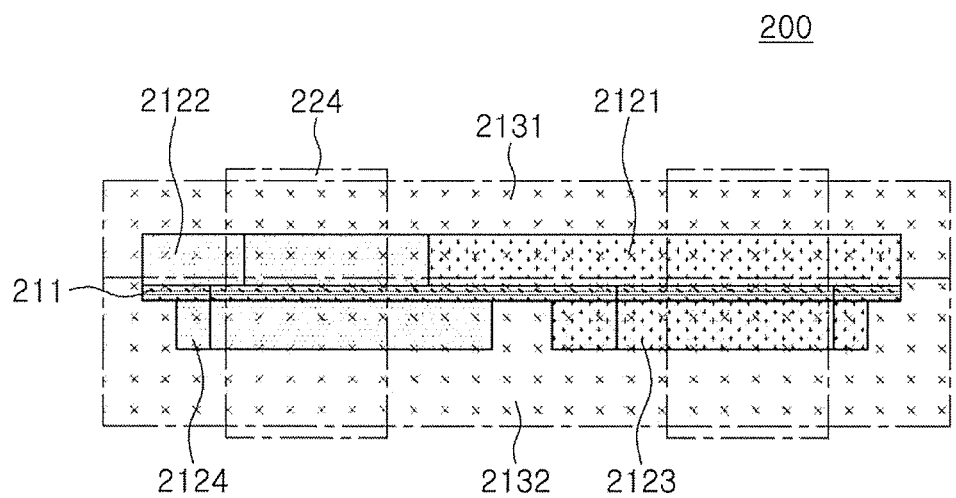
FIG. 4 is a cross-sectional view of an inductor according to a modified example of the present disclosure.

Next, FIG. 4 is a schematic cross-sectional view of an inductor 200 according to a modified example of the present disclosure. FIG. 4 is different in that the first and second encapsulants 131 and 132 are not made of different materials, but the encapsulants 131 and 132 differentiate their thicknesses, to differentiate the magnetic permeability of the first encapsulant 131 and the magnetic permeability of the second encapsulant 132, as compared with the cross-sectional view of FIG. 3.

For convenience of explanation, contents overlapping with the inductor 100 illustrated in FIG. 1 to FIG. 3 of the description of the inductor 200 illustrated in FIG. 4 will be omitted.

Referring to FIG. 4, first and second encapsulants 2131 and 2132 in the inductor 200 are made of the same material. As described above, the fact that the first and second encapsulants 2131 and 2132 are made of same material means that the same kind of metal magnetic powder and resin are included. On the other hand, the thickness of the first encapsulant 2121 is smaller than the thickness of the second encapsulant 2122.

The first encapsulant 2131 encapsulates the first and second coil units 2121 and 2122, and the second encapsulant 2132 encapsulates the third and fourth coil units 2123 and 2124. Therefore, as compared with the case in which the thicknesses of the first and second encapsulates 2131 and 2132 are equal to each other, the coupling coefficient further decreases.

On the other hand, although not specifically shown, when the thickness of the first encapsulant 2131 is larger than the thickness of the second encapsulant 2132, the coupling coefficient may be further increased as compared with the case in which the thicknesses of the first and second encapsulants 2131 and 2132 are equal.

In this manner, the coupling coefficient of the inductor 200 may be easily controlled without modifying the structure of the first to fourth coil units 2121 to 2124.

As set forth above, according to an exemplary embodiment in the present disclosure, an inductor in which a coupling coefficient of an inductor may be easily adjusted within a range of 0.1 to 0.9 may be provided.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

While exemplary embodiments have been shown and described above, it will be apparent to those skilled in the art that modifications and variations could be made without departing from the scope of the present disclosure as defined by the appended claims.

What is claimed is:
1. An inductor comprising:
a body including a support member having a first through-hole, a second through-hole, a first via-hole and a second via-hole, the first and second via-holes being spaced apart from the first and second through-holes, a first coil unit and a second coil unit disposed on a first surface of the support member in a thickness direction of the body, a third coil unit and a fourth coil unit disposed on a second surface of the support member facing the first surface in the thickness direction, and an encapsulant encapsulating the support member and the first to fourth coil units and including a magnetic material; and
a first external electrode to a fourth external electrode respectively connected to the support member and the first to fourth coil units on an external surface of the body,
wherein the encapsulant includes a first encapsulant and a second encapsulant,
wherein magnetic permeability of the first encapsulant is different from magnetic permeability of the second encapsulant, and
wherein the first encapsulant is in contact with an upper surface of the first and second coil units in the thickness direction, and the second encapsulant is in contact with a lower surface of the third and fourth coil units in the thickness direction.

2. The inductor according to claim 1, wherein the first and second coil units are wound on the same plane.

3. The inductor according to claim 1, wherein the third and fourth coil units are wound on the same plane.

4. The inductor according to claim 1, wherein the first coil unit is connected to the third coil unit through the first via-hole.

5. The inductor according to claim 1, wherein the third coil unit is connected to the fourth coil unit through the second via-hole.

6. The inductor according to claim 1, wherein the first through-hole is spaced apart from the second through-hole.

7. The inductor according to claim 1, wherein the first and second coil units are wound to share a core center.

8. The inductor according to claim 1, wherein a core center of the third coil unit is formed in the first through-hole, and a core center of the fourth coil unit is formed in the second through-hole.

9. The inductor according to claim 1, wherein an interface between the first and second encapsulants is disposed between the first surface and the second surface of the support member.

10. The inductor according to claim 1, wherein a magnetic material included in the first encapsulant is different from a magnetic material included in the second encapsulant.

11. The inductor according to claim 1, wherein a magnetic material included in the first encapsulant is the same material as a magnetic material included in the second encapsulant.

12. The inductor according to claim 11, wherein a thickness of the first encapsulant is smaller than a thickness of the second encapsulant.

13. The inductor according to claim 11, wherein a thickness of the first encapsulant is larger than a thickness of the second encapsulant.

14. The inductor according to claim 11, wherein a packing rate of magnetic particles in a resin of the first encapsulant is different from a packing rate of magnetic particles in a resin of the second encapsulant.

* * * * *